US006691284B2

(12) United States Patent
Kashyap (10) Patent No.: US 6,691,284 B2
(45) Date of Patent: Feb. 10, 2004

(54) METHOD FOR CREATING A CHARACTERIZED DIGITAL LIBRARY FOR A DIGITAL CIRCUIT DESIGN

(75) Inventor: Praveen Kashyap, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 100 days.

(21) Appl. No.: 10/128,802

(22) Filed: Apr. 24, 2002

(65) Prior Publication Data

US 2003/0204818 A1 Oct. 30, 2003

(51) Int. Cl.[7] .............................. G06F 17/50; G06G 7/62
(52) U.S. Cl. ............................................... 716/1; 703/13
(58) Field of Search ......................... 716/1, 2, 4, 18, 716/5, 6; 703/13, 14, 15, 16, 17, 19

(56) References Cited

U.S. PATENT DOCUMENTS 5,956,497 A * 9/1999 Ratzel et al. .................. 716/1
6,408,265 B1 * 6/2002 Schultz et al. ............... 703/22
6,510,540 B1 * 1/2003 Krauter et al. ................ 716/4

OTHER PUBLICATIONS

Silicon Metrics website www.siliconmetrics.com/Products/SiliconSmart CR/default.asp?ID=7, article, "SiliconSmart CR Standard Cell Characterization and Modeling", 4 pgs.

* cited by examiner

Primary Examiner—Leigh M. Garbowski
(74) Attorney, Agent, or Firm—Joanna G. Chin (57) ABSTRACT

Embodiments of the present invention relate generally to the creation of characterized outputs for a digital cell based on an input circuit design and input parameters. These characterized outputs may then be used to create digital cell libraries. One embodiment relates to selecting values for the input parameters that result in a sufficiently accurate representation of a particular characterization of the digital cell. Another embodiment relates to selecting an appropriate subwindow (i.e. a window within a larger window defined by guaranteed success and guaranteed failure boundaries) used to determine characterized output values, such as constraint values. Yet another embodiment relates to a failure recovery method that may be applied when a selected window or subwindow results in an invalid window (i.e. a window that does not contain the actual output value being determined). The failure recovery method is therefore used to determine a valid window.

28 Claims, 6 Drawing Sheets

| | | DATA SLEW IN (ns) | | | |
|---|---|---|---|---|---|
| | | 1 | 2 | 3 | 4 |
| | | 0.03 | 0.86 | 2.15 | 4.29 |
| CLOCK SLEW IN (ns) | 1  0.03 | 0.073 | 0.606 | 1.230 | 2.399 |
| | 2  0.86 | −0.348 | 0.348 | 0.812 | 1.983 |
| | 3  2.15 | −1.001 | −0.545 | 0.163 | 1.337 |
| | 4  4.29 | −2.085 | −1.627 | −0.915 | 0.266 |

|  |  | DATA SLEW IN (ns) | | | |
|---|---|---|---|---|---|
|  |  | 1 | 2 | 3 | 4 |
|  |  | 0.03 | 0.86 | 2.15 | 4.29 |
| CLOCK SLEW IN (ns) | 1  0.03 | 0.070 | 0.602 | 1.112 | 1.899 |
|  | 2  0.86 | −0.812 | 0.121 | 0.715 | 1.902 |
|  | 3  2.15 | −1.058 | −0.557 | 0.069 | 1.269 |
|  | 4  4.29 | −2.090 | −1.763 | −1.857 | 0.254 |

|  |  | DATA SLEW IN (ns) | | | |
|---|---|---|---|---|---|
|  |  | 1 | 2 | 3 | 4 |
|  |  | 0.03 | 0.86 | 2.15 | 4.29 |
| CLOCK SLEW IN (ns) | 1  0.03 | 0.070 | 0.600 | 1.300 | 1.875 |
|  | 2  0.86 | −0.812 | 0.109 | 0.803 | 1.878 |
|  | 3  2.15 | −1.070 | −0.549 | −0.157 | 1.244 |
|  | 4  4.29 | −2.097 | −1.875 | −1.869 | 0.230 |

*FIG.14*

METHOD FOR CREATING A CHARACTERIZED DIGITAL LIBRARY FOR A DIGITAL CIRCUIT DESIGN

RELATED APPLICATION

This is related to U.S. patent application Ser. No. 10/128,759, entitled "Method for Creating a Characterized Digital Library for a Digital Circuit Design," filed on Apr. 24, 2002, and assigned to the current assignee hereof.

FIELD OF THE INVENTION

The present invention relates generally to circuit design, and more specifically, to creating a characterized digital library for a digital circuit design.

RELATED ART

Digital library characterizations tools are used to create characterized digital libraries which may then be used by circuit designers. As geometries decrease and the ranges of input parameters used for creating the characterized digital libraries increases, larger volumes of simulations are required. The increase in number of simulations required to properly characterize digital circuits results in an increase in cycle time and an increase in computer and human resources. Also, the selection of the input parameters used for creating the characterized digital libraries has a large impact on the accuracy and performance of the libraries. That is, better selections result in improved accuracy and reduced cycle time. Therefore, a need exists for a reduction in simulations required and for a method for selecting input parameters to improve accuracy and reduce cycle time.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
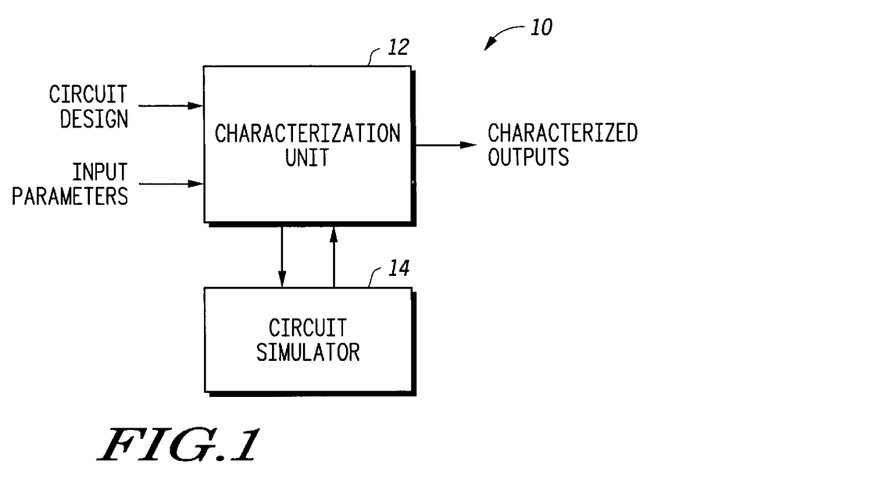
FIG. 1 illustrates a block diagram of a characterization system in accordance with one embodiment of the present invention.

FIG. 1 illustrates a characterization system 10 in accordance with one embodiment of the present invention. Characterization system 10 includes a characterization unit 12 which receives input parameters and a circuit design. Characterization system 10 also includes a circuit simulator 14 coupled to characterization unit 12, and characterization unit 12 provides characterized outputs. Note that in one embodiment, characterization unit 12 can be a processor having software instructions stored therein. Similarly, circuit simulator 14 may be software stored in the same processor or can be a separate processor or plurality of processors.

Figure 2:
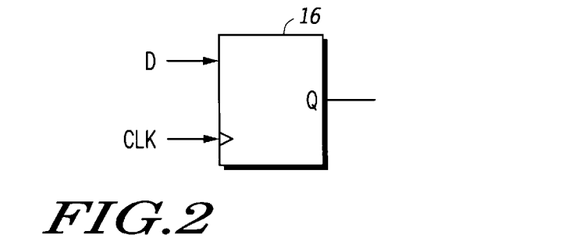
FIG. 2 illustrates a sample circuit design in accordance with one embodiment of the present invention.

In operation, characterization unit 12 receives a circuit design corresponding to a digital cell. A digital cell refers to a smaller portion of a full circuit design. In one embodiment, the digital cell may refer to the smallest building block of a full circuit design, such as, for example, a single AND gate, NOR gate, OR gate, etc. Also, the circuit design may be provided in a variety of formats. For example, the circuit design may be provided as a netlist which provides the connectivity of the transistors within the digital cell to characterization unit 12. Also, in addition the connectivity, the circuit design provides the electrical characteristics of the digital cell. FIG. 2 illustrates one example of a digital cell which represents a D-Flip Flop 16 (also referred to as a D-Flop) having a data input D, clock input CLK, and output Q. The electrical characteristics and connectivity of D-Flop 16 could therefore be provided as a circuit design to characterization unit 12. Characterization unit 12 receives the circuit design and input parameters to create characterized outputs. The input parameters, in one embodiment, include temperature (i.e. operating temperature of the circuit), process (i.e. due to variations in the fabrication of the circuit), voltage (i.e. the circuit's operating voltage), input edge rates (i.e. data slews and clock slews), and capacitive load (i.e. the load at the output of the digital cell when coupled within a larger circuit). Therefore, operation of the circuit design depends on the values of these input parameters.

Characterization unit 12 and circuit simulator 14 receive the circuit design and a variety of values for the input parameters and simulates the circuit design under a variety of different conditions to obtain characterized outputs. These characterized outputs may include propagation delay of the digital cell, power of the digital cell, or constraints of the digital cell (such as setup time, hold time, and pulse width) for a variety of different operating conditions (corresponding to the input parameters). For example, setup time for a digital cell will have one value at a particular operating temperature, but may have another value at a different operating temperature. These characterized outputs may then be stored in a database and provided as a library for use by circuit designers. That is, circuit designers may choose a characterized digital cell that corresponds to an AND gate, D-Flop, OR gate, etc, where the characterized digital cell includes information relating to its operation as a function of different operating parameters (process, temperature, voltage, edge rate, and capacitive loads). This allows the circuit designer to formulate a more accurate representation of a digital circuit.

For example, in one embodiment, 3 values may be provided for the temperature input parameter, 2 values for the process input parameter, 2 values for the voltage input parameter, 4 values for the edge rate input parameter, and 4 values for the capacitive load input parameter. In this example, there are 12 possible combinations of process, temperature, voltage. At each of these combinations, all combinations of edge rate input parameters and capacitive load input parameter need to be simulated by a circuit simulator such as circuit simulator 14. That is, characterization unit 12 provides one combination of the input parameters (where one combination includes one value for each of the input parameters) to circuit simulator 14 and receives the result for use in creating the characterized outputs. The greater the number of values used for the input parameters, the more simulations are required to obtain the characterized outputs. Therefore, selection of which values of an input parameter to use may reduce the number of simulations while improving the accuracy of the characterized outputs.

Figure 3:
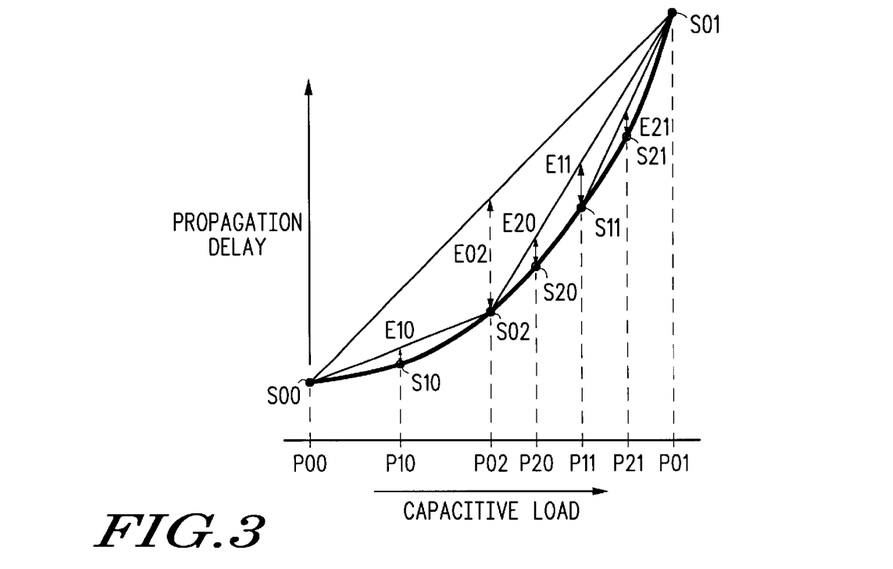
FIG. 3 illustrates a curve approximation in accordance with one embodiment of the present invention.
Figure 4:
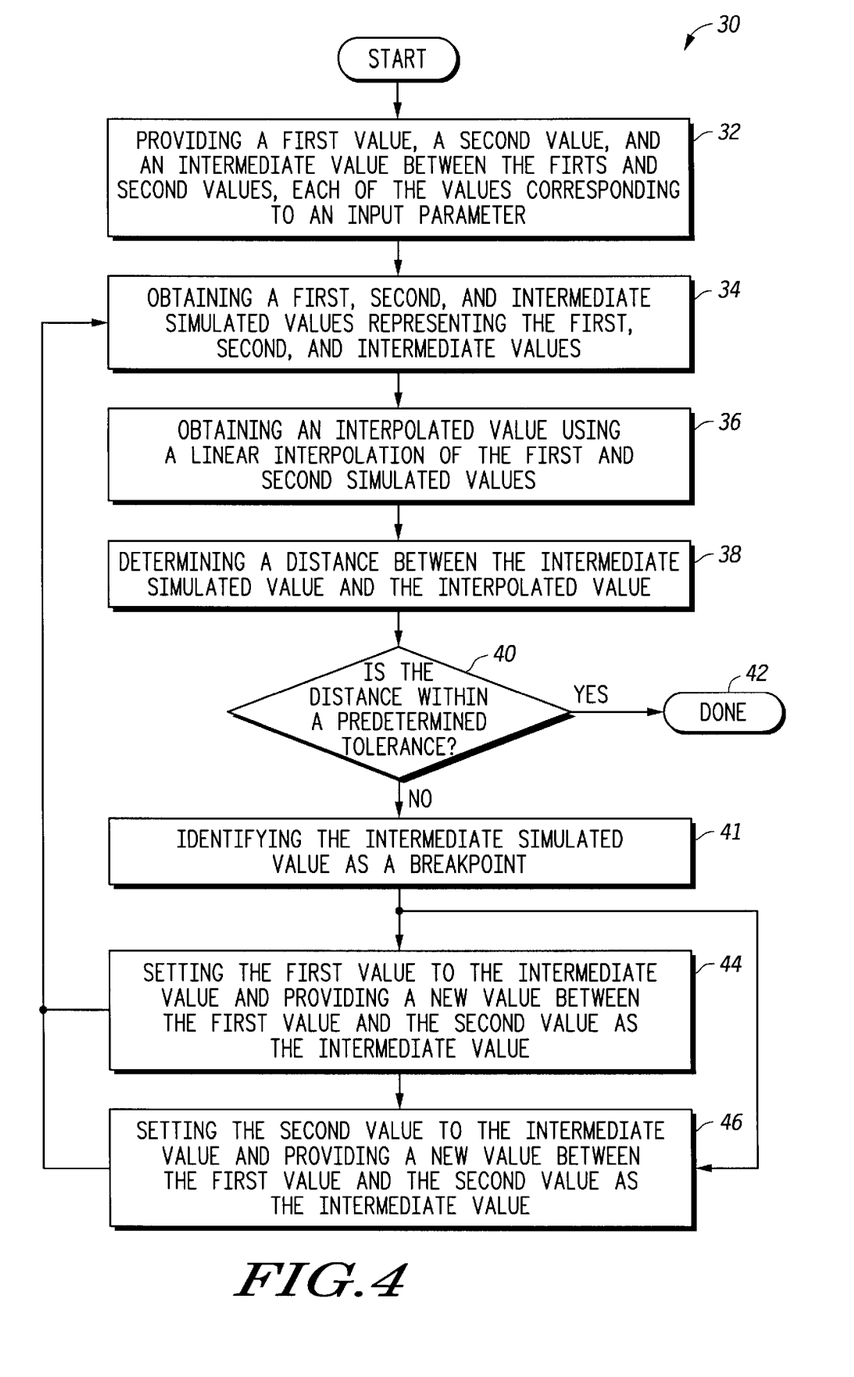
FIG. 4 illustrates, in flow diagram form, a method for approximating a curve in accordance with one embodiment of the present invention.

For example, FIG. 3 illustrates a curve representative of the propagation delay of a digital cell as a function of capacitive load. In this example, a particular fixed value of process, temperature, voltage, and edge rates has been assumed so that the propagation delay is represented as a function of capacitive load alone, thus producing a 2-dimensional representation (i.e. a curve). However, the actual curve is not previously known. Therefore, various data points (i.e. various values of capacitive load) must be selected and the digital cell simulated at each of the various values of capacitive load to provide sufficient points along the curve to accurately approximate the actual (yet unknown) curve. For example, if only four points along the curve are provided, it may not be sufficient for accurately approximating the curve using linear segments between the points. Also, the placement of the four points in this example also affects the accuracy of the linear approximation. That is, depending on which four points are chosen, the curve approximation may be better or worse. FIG. 3, in combination with FIG. 4, provide a method for selecting which values of an input parameter to use such that a sufficiently accurate curve approximation is obtained.

P00 and P01 are the lower and upper bounds for the allowable values of capacitive load. These bounds may be provided by the circuit designers which know what the minimum and maximum capacitive load will be, or alternatively, the technology and needs of the circuit design may determine the lower and upper bounds of each input parameter. That is, the upper and lower bounds of each input parameter (such as capacitive, edge rates, etc.) are generally known. The digital cell is simulated using the upper and lower bound values for capacitive load and a predetermined fixed value for the other input parameters (i.e. the predetermined fixed values corresponding to one combination of the input parameters other than capacitive load). The simulation results provide a simulated value S00 corresponding to P00 and a simulated value S01 corresponding to P01. In addition to simulating the digital cell using P00 and P01, an intermediate value, P02, is also selected and simulated to provide a simulated value S02. (Note that intermediate value P02 may also be referred to as an additional input value.) Therefore, in one embodiment, P01, P02, and P03 are all simulated simultaneously. Also, in one embodiment P02 may be the midpoint between P00 and P01; however, in alternate embodiments, P02 may be chosen to be any point between P00 and P01. Note also that the first 0 in P00, P01, S00, S01, etc. indicates that these simulated values may be obtained simultaneously. However, alternate embodiments may obtain the simulated values in any order.

After obtaining S00, S01, and S02, a distance between S02 (the intermediate simulated value) and an interpolated value (defined by S00 and S01) is determined. This distance, referred to as E02 in FIG. 3, may be the distance from S02 to a line that is defined by S00 and S01. In one embodiment, this distance is measured to a point on the line that is located on the same vertical axis as S02. E02 represents the error associated with using only S00 and S01 as the values for defining propagation delay as a function of capacitive load. If E02 is within the predetermined tolerance, then points S00 and S01 would be considered to provide a sufficient approximation of the curve where only 3 simulations were required to produce the 2 necessary simulation points. These two simulations points would be part of the characterized outputs for the digital cell. However, if E02 is greater than a predetermined tolerance, points S00 and S01 alone do not provide a sufficiently accurate curve approximation. In the example of FIG. 3, E02 surpasses the predetermined tolerance. Therefore, since E02 is too large, S02 (the intermediate simulated value) is selected as a breakpoint which "breaks" the curve approximation into two portions: one defined by P00 and P02 and the other by P02 and P01. In the former case, P00 becomes the lower bound and P02 becomes the upper bound of the subrange defined by P00 and P02. In the latter case, P02 becomes the lower bound and P01 becomes the upper bound of the subrange defined by P02 and P01. The process described above is then repeated for each of the two subranges created by the breakpoint.

As above, an intermediate value P10 is selected. P10 may be the midpoint between P00 and P02 or may be any value between P00 and P02. Since there are two subranges, an intermediate value P11 is also selected where P11 lies between P02 and P01. (P11 may be the midpoint or any other value between P02 and P01). P10 and P11 are provided to a circuit simulator (such as circuit simulator 14) to obtain simulated values S10 and S11 corresponding to P10 and P11. A distance between S10 and an interpolation value defined by S00 and S02 is then determined. In FIG. 3, this distance is labeled E10. If E10 is within the predetermined tolerance discussed above, then S00 and S02 provide a sufficiently accurate approximation of the lower portion of the curve, and no more points between P00 and P02 are necessary. In the example of FIG. 3, E10 is within the predetermined tolerance indicating that only S00 and S02 (and not S10) are provided as part of the characterized outputs. A distance between S11 and an interpolation value defined by S02 and S01 is also determined. In FIG. 3, this distance is labeled E11. If E11 is within the predetermined tolerance, then S02 and S01 provide a sufficiently accurate approximation of the upper portion of the curve. Therefore, only values P00, P02, P11, and P01 of the capacitive load input parameter would be required to obtain a sufficiently accurate approximation, and only 5 simulations were required to produce this result because the simulations may only be performed as needed.

However, in the example of FIG. 3, E11 is not within the predetermined tolerance, and therefore, it is selected as a breakpoint, just as S02 was. S11 therefore becomes a breakpoint dividing the upper portion of the curve into two more subranges, one defined by P02 and P11 and the other defined by P11 and P01. As above, P02 becomes the lower bound and P11 the upper bound of the first new subrange while P11 becomes the lower bound and P01 the upper bound of the second new subrange, and the process described above is repeated. Intermediate values within each of the new subranges are selected (P20 and P21) and simulations values S20 and S21 are obtained. A distance is determined between S20 and an interpolated value (defined by the line connecting S02 and S11), and a distance is determined between S21 and an interpolated value (defined by the line connecting S11 and S01). If the distance between S20 and the interpolated value is greater than the predetermined tolerance, it is chosen as another breakpoint, and if the distance between S21 and the interpolated value is greater than the predetermined tolerance, it is also chosen as another breakpoint, and the process continues until the distances between an intermediate value and the corresponding interpolated value (defined by the two simulation points surrounding the intermediate value) is within the predetermined tolerance.

In FIG. 3, both distances (corresponding to S20 and S21) are within the predetermined tolerance; therefore, S00, S02, S11, and S01 (represented by black dots in FIG. 3) provide a sufficiently accurate approximation of the entire curve. Notice that S10, S20, and S21 (represented by white dots in FIG. 3) are not provided as part of the characterization output since S00, S02, S22, S01 are sufficient. However, note that only 7 simulations were required to produce a sufficient curve approximation. Note that the first number following the S or P indicates which simulations may be performed simultaneously. That is, all of those Ps followed by a 0 may be simulated simultaneously, as can those Ps followed by a 1, etc. The second number simply identifies that the points can have different values (i.e. P01 and P02 or S01 or S02 generally have different values, although in some instances, S01 or S02 may have the same value.) Also, although linear interpolations were described in reference to FIG. 3 for determining the distances (e.g. E10, E11, etc.), alternate embodiments may use different interpolation techniques other than linear interpolations to determine the interpolated values.

FIG. 4 illustrates a flow 30 describing the process in flow diagram form. In block 32, a first value, second value and intermediate value is provided (these can refer to P00, P01, and P02, respectively). In block 34, first, second, and intermediate simulated values corresponding to the first, second, and intermediate values, respectively, are obtained. (These may refer to S00, S01, and S02 respectively.) In block 36, an interpolated value using a linear interpolation of the first and second simulated values is obtained. (For example, the interpolated value may refer to the point on a line defined by S00 and S01 that corresponds to S02). In block 38, a distance between the intermediate simulated value and the interpolated value is determined (e.g. these may refer to E02, E11, E11, etc.) In one embodiment, the interpolated value is on a same vertical axis as the corresponding intermediate simulated value. In decision diamond 40 it is determined whether the distance is within a predetermined tolerance. If not, flow proceeds to block 41 where the intermediate simulated value is identified as a breakpoint.

Flow then proceeds at that point to both blocks 44 and 46, wherein each of blocks 44 and 46 defines one of the new subranges created by the breakpoint. That is, block 44 sets the first value to the intermediate value and provides a new intermediate value between the first and second values (e.g. this may refer to the subrange defined by P00 and P02 with P10 as the new intermediate value). Block 46 sets the second value to the intermediate value and provides a new intermediate value between the first and second values (e.g. this may refer to the subrange defined by P02 and P01 with P11 as the new intermediate value). After blocks 44 and 46, the flow returns to block 34 where the process is repeated for each of the new subranges. Furthermore, a breakpoint may be identified with each subrange (in block 41) where the process would be repeated for each of the new subranges defined by this subsequently identified breakpoint. If, at decision diamond, the distance is determined to be within the predetermined tolerance, then the process is complete (at block 42) because the necessary simulated values to sufficiently approximate the curve have been identified.

Figure 5:
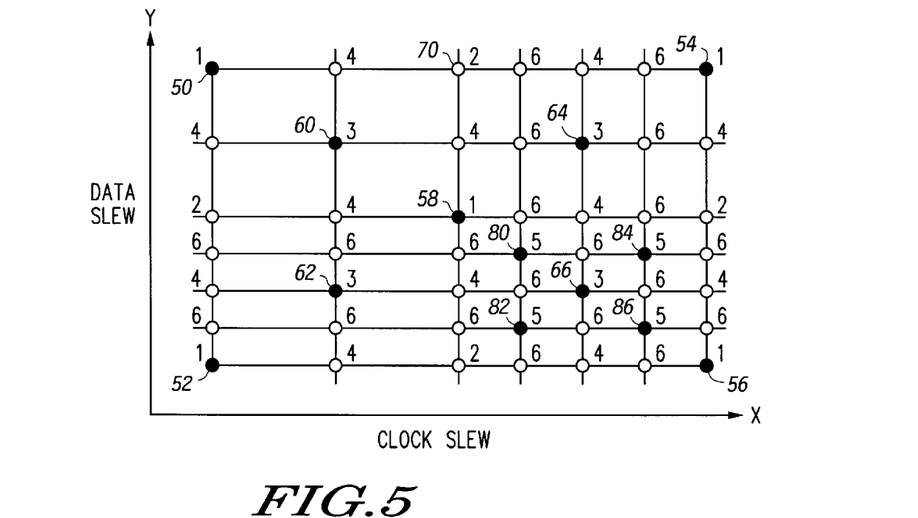
FIG. 5 illustrates a surface approximation in accordance with one embodiment of the present invention.

The method described in FIGS. 3 and 4 can also be extended to apply to a 3-dimensional surface. For example, a characterization can determine setup time for a digital cell as a function of two input parameters such as data slew and clock slew (i.e. input edge rates). In this case, the setup values can be plotted as a surface overlying a grid defined by x and y axis, where the setup values correspond to the z axis. For example, FIG. 5 illustrates a top down view of a grid which may correspond to an x and y axis. In one embodiment, the x axis may refer to the clock slew and the y axis to the data slew. Above this grid would lie a surface representing the setup times as a function of clock slew and data slew. This surface is unknown, though, analogous to the curve of FIG. 3, and sufficient input parameter points (and their corresponding simulated values) are required to be able to approximate the surface within a predetermined tolerance. The black dots of FIG. 5 indicate the simulated values obtained by simulating the digital cell using the corresponding clock and data slew at each of these points. The white dots in FIG. 5 are obtained either by simulating the digital cell using the corresponding clock and data slew at each of these points, or they may be obtained by interpolation using surrounding simulated values (i.e. using the values of surrounding black dots). Simulation may provide a more accurate result for the setup times at each point; however more time is required to perform a simulation. Alternatively, if interpolation values are used, accuracy may be reduced but time can be reduced. The numbers 1–6 written next to each black dot or white dots refers to the order in which the values can be obtained. For example, those dots with a 1 next to them indicate that they may be determined first. Those with a 6 are generally determined after those with a 5, etc.

As with points P00 and P01 of FIG. 3, the boundary points 50, 52, 54, and 56 are generally provided by the circuit designers or defined by the technology. They represent the simulated values corresponding to the 4 combinations of maximum clock slew, minimum clock slew, maximum data slew, and minimum data slew. As with FIG. 3, an intermediate value is selected within the domain defined by points 50, 52, 54, and 56. In the embodiment of FIG. 5, this domain is a domain rectangle and the intermediate point is chosen as the center of the domain rectangle. However, alternate embodiments may choose different values other than the center. The intermediate point (corresponding in this embodiment to a clock slew value and a data slew value) is then simulated to obtain an intermediate simulated point (point 58). In one embodiment, all of points 50, 52, 54, 56, and 58 may be obtained simultaneously. A distance is then determined from the intermediate simulated point (point 58) and an interpolated value. This interpolated value may correspond to an interpolated point on a bilinear surface defined by points 50, 52, 54, and 56. In one embodiment, the interpolation point lies along the same z axis as the intermediate simulated point (point 58). Also note that other methods other than the use of a bilinear surface may be used to determined the interpolated value.

If the distance determined from the intermediate simulated value to the interpolated value is within a predetermined error tolerance, then points 50, 52, 54, and 56 are deemed sufficient to provide a sufficiently accurate approximation of the desired surface. However, if the distance is not within the predetermined error tolerance, the intermediate simulated value is identified as a breakpoint, and breaks the domain defined by points 50, 52, 54, and 56 into four subdomains (each subdomain, in this example, being one of the four quadrants of the grid in FIG. 5). The process is then repeated for each of the four quadrants. That is, an intermediate point is selected within each of the four quadrants and simulated to provide intermediate simulated points (points 60, 62, 64, and 66). The intermediate point may be the center of the corresponding quadrant or may be any other point within the quadrant. A distance is then determined from each intermediate simulated point to an interpolation point that is defined by the four corners (or any other four points) of the corresponding quadrant. For example, the interpolation point corresponding to intermediate simulated point 60 can be derived from a bilinear surface defined by points 50, 58, 70 and 72 (note that points 70 and 72 will be discussed further below). If any of the distances falls outside the predetermined error tolerance, the corresponding intermediate simulated point becomes another breakpoint.

For example, the distance corresponding to intermediate simulated point 66 of FIG. 5 did not fall within the predetermined tolerance, therefore, four subdomains are further defined and intermediate values are selected for each of the four new subdomains. These intermediate values are simulated to provide intermediate simulated points 80, 82, 84, and 86. The process is repeated until all distances fall within the predetermined tolerance. In the example of FIG. 5, all distances are within the predetermined tolerance after performing the two subdivisions discussed above. Therefore, points 50, 52, 54, 56, 58, and 66 provide a sufficiently accurate approximation of the surface and are provided as characterized outputs.

The white dots of FIG. 5 represent auxiliary points which preserve a uniform rectangular grid. For example, after simulated points 50, 52, 54, 56, and 58 are obtained, auxiliary points (labeled with a "2") are evaluated. These auxiliary points, in one embodiment lie along the mid-points of the boundaries. Likewise, after simulated points labeled with a "3" (points 60, 62, 64, and 66) are obtained, auxiliary points (labeled with a "4") are evaluated. In the embodiment illustrated in FIG. 5, these auxiliary points labeled "4" lie along the mid-points of the boundaries of each subdomain defined by breakpoint 58. Additional auxiliary points (such as those labeled "6") may also be added to maintain grid uniformity. In alternate embodiments, these auxiliary points may not be necessary at all or only subset may be required, depending on the requirements of the characterization system being used. Furthermore, these auxiliary points can either be obtained by simulating the corresponding input parameter values (e.g. the corresponding clock slew and data slew in the current example) or they can be obtained by interpolated between surrounding points.

Figure 6:
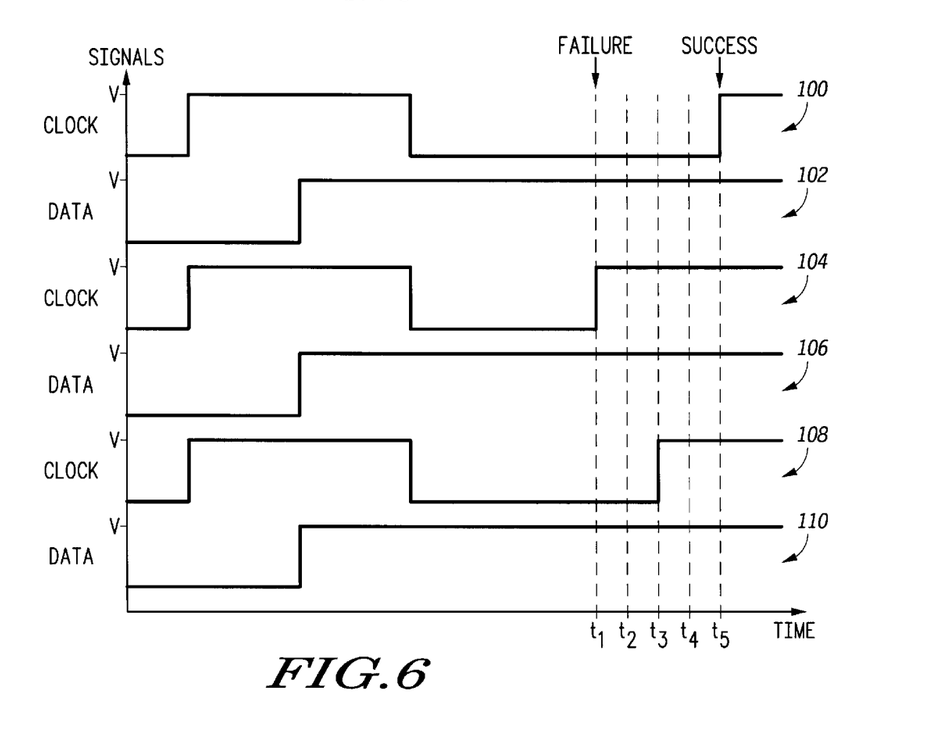
FIG. 6 illustrates data and clock waveforms used in accordance with one embodiment of the present invention.

FIGS. 3–5 discussed above describe one method for choosing appropriate input parameter values. The above method is applicable to any input parameter or combination of input parameters. These input parameters, in addition to the input circuit design, as discussed above, are used to produce characterized outputs such as constraint measurements. These constraint measurements, such as setup time (the amount of time before an active clock edge that the data must be valid), hold time (the amount of time after an active clock edge that the data must be valid), pulse width (the minimum pulse width of the data required to affect the digital cell output), etc. may be obtained using a binary subdivision method. FIG. 6 illustrates waveforms corresponding to input data and clock for a digital cell. The waveforms correspond to simulations performed at a particular temperature value, process value, voltage value, and with particular edge rate values for the clock and data. Therefore, the setup value obtained from the waveforms of FIG. 6 correspond to one combination of the input parameters. (Note also that in this embodiment, the determination of the setup value is performed assuming there is no load, therefore a value for capacitive load is not included in the combination of input parameters. Similarly, more or less input parameters may be used, as desired or as needed.

The binary subdivision method begins with a window defined by a guaranteed failure boundary corresponding to time t1 and a guaranteed success boundary corresponding to time t5. That is, these boundaries may correspond, in one example, to D-Flop 16 of FIG. 2. In the example of FIG. 6, the failure and success boundary correspond to the points at which an active clock edge is received. (Note that an active clock edge may refer to either a rising or falling clock edge, depending on if the clock is active high or low.) If the active clock edge is received at the guaranteed failure boundary (see waveforms 104 and 106), then the output Q of D-Flop 16 will not provide the correct output. However, if the active clock edge is received at the guaranteed success boundary (see waveforms 100 and 102), then the output Q will provide the correct output. Therefore, at the guaranteed failure and guaranteed success boundaries, it is known that the circuit design will fail or succeed, respectively. It is also known that the actual constraint value being evaluated (in this example, the setup time) corresponds to some point within the window defined by a guaranteed failure and a guaranteed success. A binary subdivision is then performed and the circuit design is simulated with an active clock edge occurring at a midpoint t3 between time t1 and time t5 (see waveforms 108 and 110). If the simulation results in a failure (i.e. the circuit design failed to operate properly), then this is selected as the new failure boundary (corresponding to time t3). If the time between t3 and t5 is within a predetermined resolution, then the process ends, and the success boundary is used to provide the resulting setup time (where the time between the rising edge of the data in waveform 110 and the success boundary at time t5 corresponds to the setup time).

If the time between t3 and t5 is not within the predetermined resolution, another iteration is performed where a simulation is performed with the clock having an active edge at time t4 (the midpoint between t3 and t5, obtained with a binary subdivision). If a failure is obtained, the window corresponding to the actual constraint measurement (setup time in this example) is now defined by time t4 and t5. If this is within the predetermined resolution, the process ends, and the success boundary (time t5 in this example) is used to provide the constraint measurement (setup time). If, however, a success is obtained at time t4, the window corresponding to the actual constraint measurement is defined by time t3 and t4 because the success boundary would now correspond to time t4 rather than t5. If the time between t3 and t4 is within the predetermined resolution, the process ends and time t4 is used to provide the constraint measurement. If the window is still not within the predetermined resolution, the binary subdivision method described above continues, each time determining a new midpoint, simulating the midpoint to determine a success or failure, and redefining the success or failure boundary as the midpoint, thus shrinking the window upon each iteration until the window falls within a predetermined resolution.

Note that if the simulation of waveforms 108 and 110 had resulted in a success (i.e. if the digital circuit design operated properly) rather than a failure, then time t3 would become the new success boundary, and the subwindow would be defined between t1 and t3. If this is not within the predetermined resolution, the midpoint (at t2) would be selected for another simulation, and based on the result (success or failure), time t2 would become either the new failure or the new success boundary, and the window will be smaller. As described above, the binary subdivision method continues until the window falls within the predetermined resolution. At this point, the resulting success boundary is used to provide the constraint measurement (although alternate embodiments may use different values within the resulting subwindow to provide the constraint measurement).

Note that the predetermined resolution may be a user defined value. Also note that while in the embodiment of FIG. 6, the active clock edge was shifted each iteration for the new simulation, alternate embodiment may choose to shift other signals instead, such as the data. Also, in this embodiment, the guaranteed failure corresponded to a lower bound and guaranteed success to an upper bound, however alternate embodiments may have the boundaries reversed where a guaranteed success would be before the guaranteed failure. Also, the window defined by the guaranteed failure and guaranteed success boundaries is generally a valid window, i.e. large enough to guarantee success and failure at the boundaries. Such a large window may require multiple iterations to continually subdivide the window until the predetermined user resolution is achieved. In one embodiment, the same starting window (corresponding to the guaranteed success and failure boundaries) is used for each combination of input parameters. That is for each new combination of input parameters, the same large window is used thus resulting in a large number of iterations for each combination of input parameter values. Therefore, in one embodiment of the present invention, a subwindow within the window corresponding to the guaranteed success and guaranteed failure boundaries may be chosen.

Figure 7:
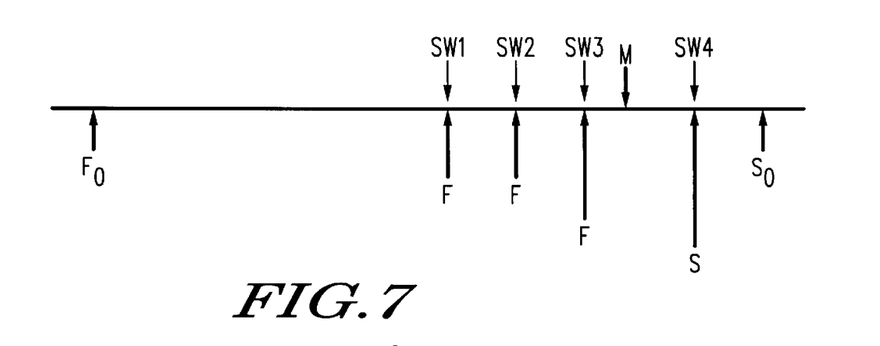
FIG. 7 illustrates an adaptive failure recovery mechanism in accordance with one embodiment of the present invention.

FIG. 7 illustrates a window having a guaranteed failure boundary, F0, and a guaranteed success boundary, S0. However, rather than beginning with this larger window, a subwindow is chosen (defined by SW1 and SW2). This subwindow can be chosen based on historical data corresponding to previous simulations. Alternatively, this subwindow may be empirically determined. The subwindow boundaries SW1 and SW2 are then simulated to determine whether a pass or fail condition occurs at the boundaries. If one of the two boundaries results in a failure and the other of the two boundaries results in a success, then the smaller subwindow is a valid window and contains the actual constraint value, and the binary subdivision method described above can be used to further divide the window into smaller windows until the smaller window falls within a predetermined resolution (at which point, the actual constraint value can be determined within the predetermined resolution). Therefore, fewer iterations are required if a subwindow can be chosen rather than starting off with the larger window (defined by F0 and S0).

However, if the simulation at the boundaries SW1 and SW2 result in both being successes or both being failures, then the subwindow is not valid and does not contain the actual constraint value. An adaptive failure recovery is then performed, as shown in FIG. 7. In the example of FIG. 7, SW1 and SW2 both resulted in a failure (indicated by F). Therefore, a new upper boundary is selected in an attempt to find a boundary which defines a valid window. A new boundary SW3 is defined, and the new subwindow is bounded by SW2 and SW3. In this embodiment, SW3 is selected such that the distance between SW1 and SW2 is the same as the distance between SW2 and SW3. Therefore, in this example, the new subwindow is the same size as the original subwindow defined by SW1 and SW2. However, alternate embodiments may choose to select SW3 closer to or farther away from SW2. (Also note that alternate embodiments may use the window bounded by SW1 and SW3, rather than SW2 and SW3, as the new subwindow where this new subwindow is twice the size of the original window.)

If simulation of SW3 results in a success, then the actual constraint value is known to be within the subwindow defined by SW2 and SW3, and binary subdivision may then be used until the subwindow is within a predetermined resolution and the actual constraint value can be determined. However, in the example of FIG. 7, SW3 also results in a failure after simulation; therefore, a valid subwindow has not yet been defined (i.e. the subwindow defined by SW2 and SW3 does not contain the actual constraint value). Therefore, a new boundary, SW4, is selected. In this embodiment, SW4 is selected such that the new subwindow (defined by SW3 and SW4) is now two times the original subwindow defined by SW1 and SW2. In the embodiment of FIG. 7, simulation of SW4 results in a success; and therefore, the subwindow defined by SW3 and SW4 is known to contain the desired constraint value being evaluated (indicated with an M in FIG. 7). M can be evaluated by performing binary subdivisions (as described above) beginning with the subwindow defined by SW3 and SW4. Therefore, a valid window (in this case, the window defined by SW3 and SW4) is considered as having a failure boundary and a success boundary, where the actual constraint (in this case, M) is located within the valid window. Alternatively, the valid subwindow could have been defined as SW1 and SW4 (4 times the original subwindow) or SW2 and SW4, rather than SW3 and SW4. All of these would be valid subwindows for determining constraint value M, however, more iteration and simulations may be required.

Note that in one embodiment, the guaranteed success boundary, S0, may be used as an upper limit such that the adaptive failure recovery discussed above does not select a new boundary that is beyond the guaranteed success boundary. Also, upon the selection of each new boundary, the window size can be increased by factors of 2, as shown in FIG. 7. However, alternate embodiments may select new boundaries by varying the subwindow size in a variety of ways.

While the example of FIG. 7 relates to a subwindow that results in two failures, alternatively, a subwindow may result in two successes upon simulation. For example, SW1 and SW2 may have resulted in successes rather than failures. In this case, new boundaries are selected to the left of SW1 (not shown) until a failure boundary is reached and a valid window is found. Similarly, the guaranteed failure boundary, F0, can provide a lower limit such that the adaptive failure recovery discussed above does not select a new boundary that is beyond the guaranteed failure boundary.

Figure 8:
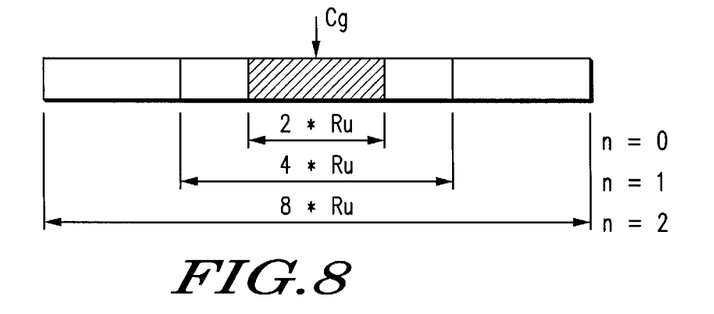
FIG. 8 illustrates a guard banded window in accordance with one embodiment of the present invention.

FIG. 8 illustrates one embodiment of a guard banded window that will be used in discussing FIGS. 10–14 below. A constraint measurement value (e.g. setup time, hold time, pulse width, etc.) may be estimated from several sources, and the concept of a guard banded window allows the actual constraint value to be computed from an estimated value.

The estimated value, for example, can be taken from historical data, or libraries for similar digital cells to the one currently being characterized. In FIG. 8, Cg represents an estimated constraint value, and Ru represents the predetermined resolution (which, as mentioned above, can be a user specified value). Note that if the reduced window bounds are defined as Cg+Ru and Cg−Ru, it will only take one iteration (one binary subdivision) to find the constraint value because after the one iteration, the window will be within the predetermined resolution (i.e. the window width will equal Ru). Similarly, if the reduced window bounds are Cg+($2^n$) *Ru and Cg−($2^n$)*Ru, then it will take n+1 iterations to find the constraint value (because it will take n+1 iterations, or subdivisions, to obtain a window having the size Ru). Therefore, FIG. 8 illustrates 3 reduced window sizes, where n=0 for the smallest, n=1 for the next smallest, and n=2 for the largest. For example, for the largest window illustrated in FIG. 8, n=2 (thus resulting in a window size of 8*Ru) and thus it would take 3 (i.e. n+1) subdivisions to obtain the constraint value within the predetermined resolution (Ru).

The above iteration or subdivision values (i.e. n+1) for the guard banded window assume that, for whichever window bounds are chosen, one bound results in a success and the other a failure. That is, if a reduced window having n=0 is chosen based on an estimated value Cg, then only one iteration will be required assuming that the actual constraint measurements is close to Cg and also lies within the same window. However, it may turn out that the actual constraint value is not close to enough to Cg, and therefore falls outside of the reduced window chosen about Cg. In this situation, the guard band window is not a valid window and the failure recovery method described above in reference to FIG. 7 can be applied in order to locate a valid window (i.e. a window containing the actual constraint value) which will be bounded by one bound that produces a success and one that produces a failure. In one embodiment, the failure recovery method can increase one of the two boundaries (which one will depend on whether successes or failures occurred on both boundaries). For example, in the case that boundaries corresponding to n=1 where chosen and both boundaries resulted in a success, then the left boundary can be moved from Cg−$2^1$*Ru to Cg−$2^2$*Ru, and the new reduced window would therefore be bounded by Cg−4*Ru to Cg−2*Ru, which are multiples of Ru. (However, note that neither the failure recovery nor the initial band selection has to be based on multiples of Ru; alternate embodiments may use different values for the reduced window boundary and the failure recovery.)

Figure 9:
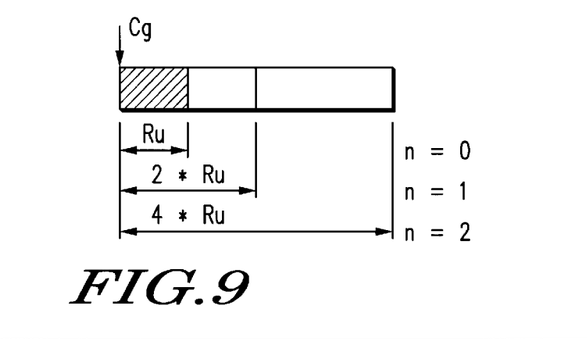
FIG. 9 illustrates and lower guarded window in accordance with one embodiment of the present invention.

FIG. 9 illustrates the concept of an upper or lower guard banded window. There may be some situations in which the estimated constraint value is the upper or the lower bound of the reduced window. For example, if it is known that the actual constraint value being computed is less than the estimated constraint value, Cg, then Cg can be used as the lower bound, and the upper bound can be defined as Cg+($2^n$)*Ru. The example of FIG. 9 illustrates three upper guard banded windows corresponding to n=0, n=1, and n=2, from smallest window to largest window, respectively. In this example, if the smallest upper guard banded window is selected, then no iterations are required to find the actual constraint value because the window is already the size of the predetermined resolution (Ru). Similarly, for n=1, only 1 iteration (or subdivision) would be required, and for n=2, 2 iterations would be required. Therefore, the number of iterations can be generalized as being n for an upper guard banded window bounded by Cg and Cg+($2^n$)*Ru. The same applies for a lower guard banded window (not shown) which is bounded by Cg−($2^n$)*Ru and Cg. Similarly, only n iterations are required to determine the actual constraint value (within a resolution of Ru).

As discussed with reference to the guard banded window, the number of iterations for the upper or lower guard banded window also depends on whether the reduced window initially chosen is valid (i.e. whether the actual constraint value actually falls within the reduced window). If not, the failure recovery method discussed in reference to FIG. 7 may be used to find a valid window prior to performing subdivisions. In this case, more simulations will be required, because simulations must be performed first for the failure recovery portion and then on each subdivision once the valid window is determined. Therefore, FIGS. 8 and 9 illustrate how reduced window sizes may be chosen based on historical or estimated constraint values corresponding to an actual constraint value being computed which may result in fewer iterations (and thus fewer simulations, which saves time). Although the reduced window sizes discussed in reference to FIGS. 8 and 9 used window boundaries that are multiples of Ru, alternate embodiments may select window boundaries using any method. That is, the window boundaries can be based on the estimated constraint value without having to be multiples of Ru.

FIGS. 10–14 illustrate one example of performing constraint measurements that utilize the subdivision described in reference to FIG. 6, the failure recovery described in reference to FIG. 7, and the guard banded windows (including upper and lower guard banded windows) described in reference to FIGS. 8 and 9. FIGS. 10–14 correspond to the characterization of a D-Flop (such as, for example, D-Flop 16 of FIG. 2) for three different drive strengths 1, 2, and 4. The characterizations for each drive strength determine the setup time based on clock slew and data slew input parameters (i.e. input edge rates). The example tables illustrated in FIGS. 10, 12, and 14 (corresponding to drive strengths of 1, 2, and 4, respectively) use 4 values for each input parameter (i.e. 4 values for clock clew and data slew: 0.03, 0.86, 2.15, and 4.29). The values chosen for the input parameters may be provided in a variety of different ways. For example, they can be chosen based on historical values. That is, over a series of characterizations, these values may have been determined to provide the most accurate representation of the setup times. Alternatively, the method described in reference to FIGS. 3–5 may be used to determine the number of and value of the input parameters that provides a sufficiently accurate representation of the surface that represents setup time as a function of both clock slew and data slew for a given drive strength.

Figure 10:
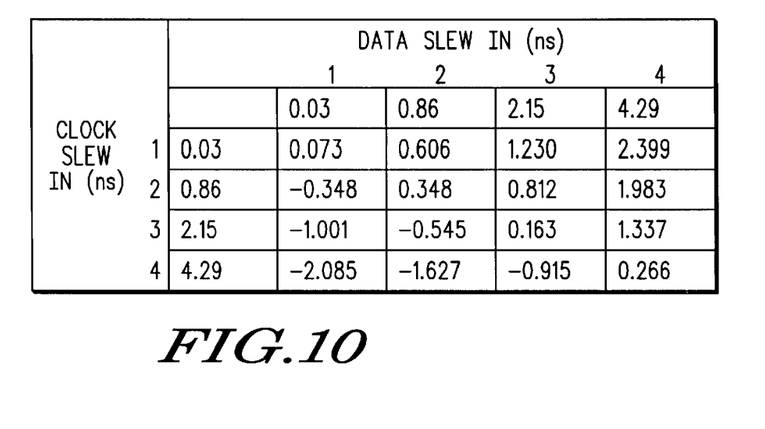
FIG. 10 illustrates a table illustrating example setup values for a D-Flop having a drive strength of 1.

The table of FIG. 10 illustrates a table having four rows corresponding to clock slew values of 0.03, 0.86, 2.15, and 4.29 and four columns corresponding to data slew vales of 0.03, 0.86, 2.15, and 4.29. FIG. 10 illustrates the final table; however, when a characterization first begins, no values are yet known. Therefore, in one embodiment of the present invention, the values at (4,1) and (1, 4) are evaluated first. (Note that the notation (x,y) refers to row x and column y.) The values reflect the minimum setup value (which occurs at the minimum data slew and maximum clock slew) and the maximum setup value (which occurs at the maximum data slew and minimum clock slew), respectively.

These setup values can be computed in a variety of different ways. One embodiment may calculate these values using a larger window (such as the window described in reference to FIG. 6) where one boundary is a guaranteed success and the other is a guaranteed failure. Then subsequent subdivisions (i.e. iterations) may be performed to bring in the guaranteed success or guaranteed failure boundaries to a distance of less than or equal to a predetermined resolution from each other. The setup time can then be determined from the success boundary. Thus the values in (4,1) and (1,4) may represent the simulated values (in this example, corresponding to setup times) that fall within a predetermined resolution of the actual value. Alternatively, a smaller window can be chosen where failure recovery may be necessary if the smaller window is not bounded by a success and a failure (i.e. if the smaller window is not valid).

An alternate embodiment may use historical values taken from the characterizations of similar D-Flop cells or taken from the characterizations of other digital cells which may be expected to have similar setup time values. In this embodiment, a guard banded window (such as the one described in reference to FIG. 8) may be selected about the historical value where the historical value represents the expected value, Cg. The guard banded window can be chosen to have a variety of different sizes. If multiples of Ru are used as illustrated in FIG. 8, then n can be chosen to be any value, depending on the aggressiveness of the algorithm. That is, the smaller the window chosen, the less iterations required; however, the higher the chance that the actual constraint measurement is located outside the window thus requiring a failure recovery. If it is known whether the actual constraint value is less than or greater than the historical value used as Cg, then the number of iterations can be reduced by using an upper or lower guard banded window as described in reference to FIG. 9. The window can be of any size and is not limited to a multiple of Ru. As with the guard bounded window, the smaller the window, the less iterations required; however, the greater the chance that the actual constraint measurement falls outside the window thus requiring more iterations due to failure recovery.

Once the setup values at (1,4) and (4,1) are determined, these values (2.399, which represents the maximum setup time, and −2.085, which represents the minimum setup time) may be used to calculate the other two "corners": the values at (1,1) and (4,4). Since 2.399 and −2.085 are the maximum and minimum values, these can be used as the bounds for the window used to determine (1,1) and (4,4) which are known to fall within these bounds. Subsequent simulations and subdivisions are performed until the window size is reduced to less than or equal to the predetermined resolution. Alternatively, guarded windows may be used if historical values are known to provide an estimate for the values.

Figure 11:
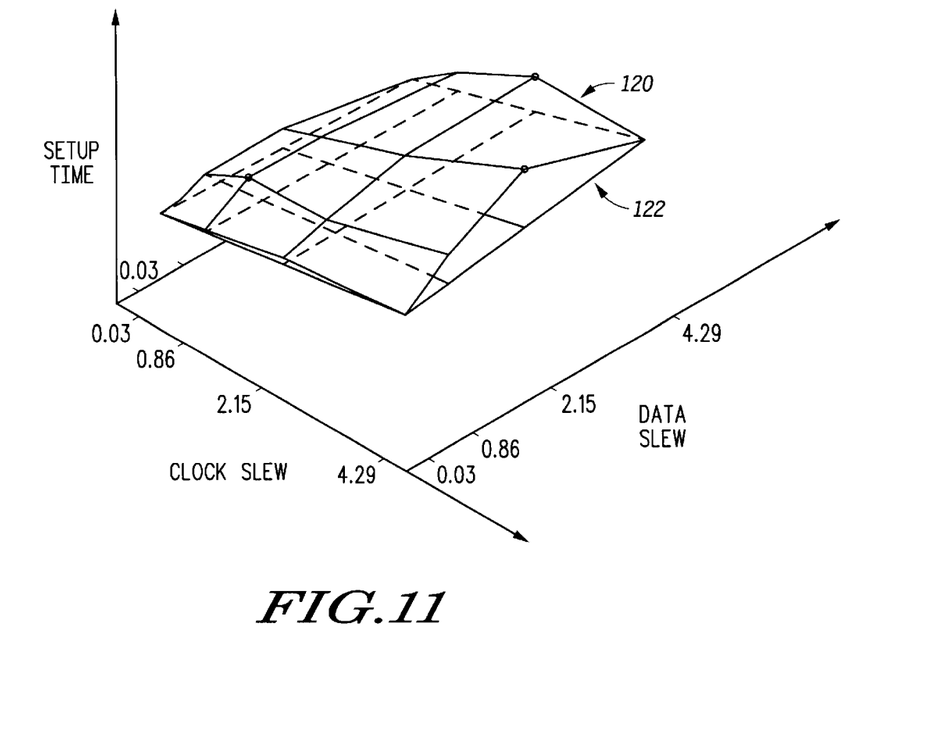
FIG. 11 illustrates a surface corresponding to the example setup values of FIG. 10.

After obtaining the four corners of the table, the remaining 12 values can be estimated using bilinear interpolation. (Note that in alternate embodiments, other interpolation methods other than bilinear interpolation may be used.) The four corner values can be used to define a bilinear surface which may then be used as an estimated constraint value for each of the 12 remaining values. FIG. 11 illustrates a 3-dimensional graph of an actual surface corresponding to setup times as a function of clock slew and data slew for a D-Flop having a drive strength of 1. Surface 120 is not yet known, but 16 values will be determined (which, in one embodiment, correspond to the resulting 16 values of the table of FIG. 10) to characterize surface 120. (Note that the values of surface 120 do not correspond directly to the values in the table of FIG. 10. That is, surface 120, representative of a D-Flop having a drive strength of 1, is being used for illustrative purposes in describing how values in the table can be determined. For example, the value at clock slew 2.15 and data slew 0.86 illustrated by surface 120 is not intended to correspond to −0.545 exactly, which is the value from the table of FIG. 10.) Surface 122 represents the bilinear plane defined by the four corner values that have already been determined. Since the 12 remaining values generally lie above bilinear surface 122, an interpolation value determined from bilinear surface 122 can be used as Cg for each of the 12 values within an upper guard banded window. An upper guard banded window having n=2 provides a sufficient window size to capture 9 of the remaining 12 values. The remaining 3 values (illustrated in FIG. 11 as circled points) will not be captured if an upper guard banded window having n=2 is used, thus resulting in an invalid window for these 3 values. Therefore, for these 3 values, a failure recovery would be required. In the example of FIG. 11, using an upper guard banded window of n=2 therefore allows 9 of the remaining 12 values to be determined in 2 iterations each for a total of only 18 iterations. The remaining 3 values would each require 3 iterations (2 plus an additional one due to failure recovery) for a total of 9 iterations.

For example, for the value at (2,2), an interpolated value from bilinear surface 122 taken at clock slew =0.86 and data slew =0.86 provides an estimated value, Cg, for determining the actual setup time measurement. In this example, an upper guard banded window of n=2 is selected. However, as illustrated on FIG. 11, the value of surface 120 at clock slew =0.86 and data slew =0.86, is not within the selected window size (as indicated by a circle around the value). Therefore, failure recovery is used to determined the setup time. For the value at (2,3), an interpolated value from bilinear surface 122 is taken at clock slew =0.86 and data slew =2.15. The value of surface 120, in the current example, does fall within the selected window size and therefore, in 2 iterations, the setup time value corresponding to the clock slew 0.86 and data slew 2.15 is determined. (Once again, note that the values of surfaces 122 and 120 do not correspond directly to the values in the table of FIG. 10; however, surfaces 122 and 120 are still helpful in understanding the general principles applied to obtain the values in the table of FIG. 10.)

Figure 12:
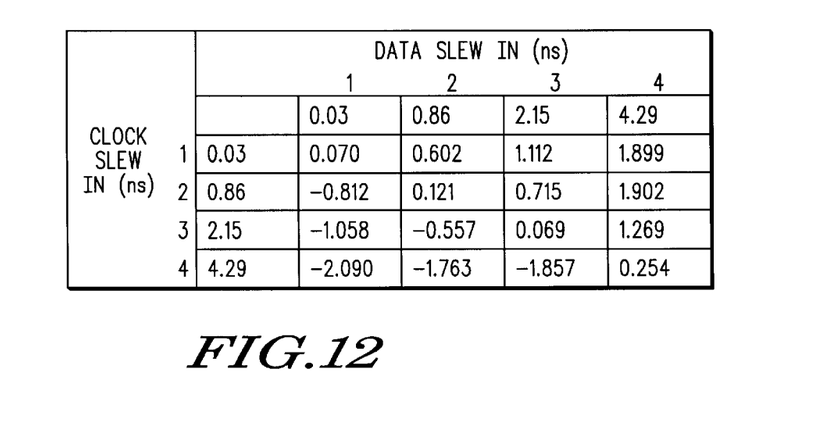
FIG. 12 illustrates a table illustrating example setup values for a D-Flop having a drive strength of 2.

FIG. 12 illustrates the setup times corresponding to the same clock slew and data slew values as in the table of FIG. 10. However, the values in the table of FIG. 12 represent setup time values assuming a D-Flop strength of 2 rather than 1. Therefore, the tables of FIG. 10 and 12 illustrate a characterization of the same D-Flop but at different drive strengths. In one embodiment, the values of the table in FIG. 12 can be determined in the same manner described above in reference to FIG. 10. However, in an alternate embodiment, the values of the table in FIG. 10 for a drive strength of 1 can be used as estimated values for the setup times of FIG. 12 since the setup times for a drive strength of 2 do not vary too much from the setup times for a drive strength of 1. Since the values do not vary too much from each other, reduced window sizes may be selected. For example, a lower guard banded window may be used since the setup time values for drive strength 2 are generally less than for those of drive strength 1. Depending on how much the values are expected to vary, an n value can be determined for the lower guard banded window. If the n value does not provide a valid window for some points, then failure recovery can be performed for these points. (Alternatively, an upper guard banded window may be used if the setup time values are generally greater than the estimated values being used, or if it is unknown whether the setup values are greater or less than the estimated values being used, a guard banded window may be used. In either case, an n value may be chosen depending on how much the actual values are expected to vary from the estimated values.)

Figure 13:
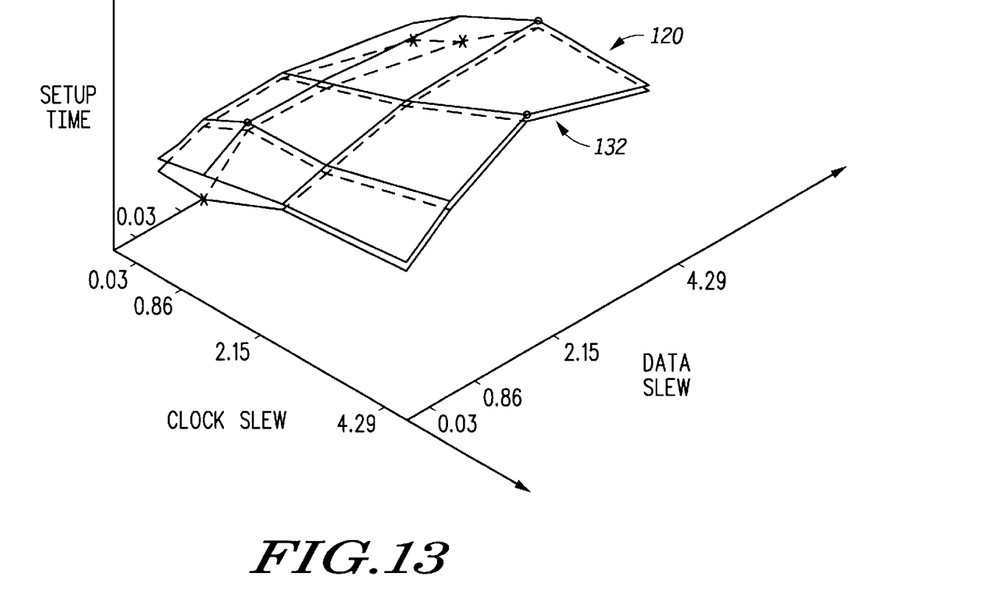
FIG. 13 illustrates surfaces corresponding to the example setup values of FIG. 10 and FIG. 12.

For example, FIG. 13 illustrates surface 120 corresponding to drive strength 1 and a surface 132 that lies generally below surface 120 and corresponds to drive strength 2. (Note also, as with FIG. 11 and FIG. 10, the values of surface 132 do not correspond exactly to the values in the table of FIG. 12. For example, the value given by surface 132 at clock slew 2.15 and data slew 0.86 does not necessarily correspond to the value at the same clock and data slew given in the table of FIG. 12. That is, surface 132 is simply representative of a D-Flop having a drive strength of 2, and FIG. 13 is being used to illustrate one example of the relation between surface 120 of FIG. 11, corresponding to a drive strength of 1, and surface 122, corresponding to a drive strength of 2. FIG. 13 is also used to describe how the values in the table of FIG. 12 may be determined.) In this embodiment, all except 3 of the points can be determined using a lower guard banded window having n=0 thus requiring no iterations. The remaining 3 (indicated by X's on the points in FIG. 13) require at least one iteration each because failure recovery is required to determine a valid window. These remaining 3 values can lie further below the estimated value corresponding to drive strength 1, as shown in FIG. 13, or alternatively, some or all may lie above the estimated value corresponding to drive strength 1. In either case, though, failure recovery may be performed to define a valid window for these points.

Figure 14:
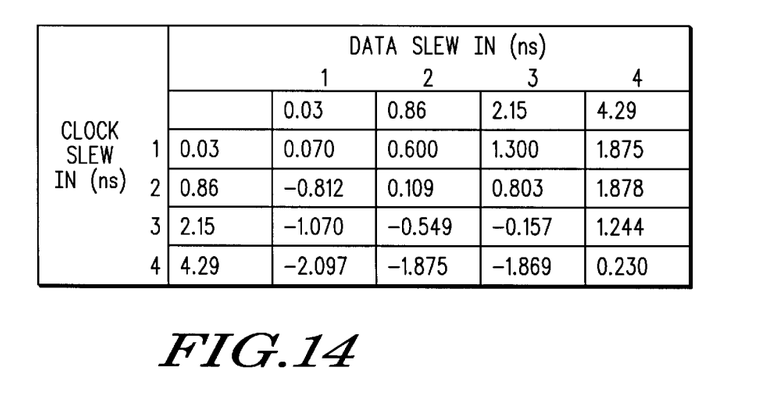
FIG. 14 illustrates a table illustrating example setup values for a D-Flop having a drive strength of 4.

FIG. 14 illustrates setup values for a D-Flop of drive strength 4. The values can be determined as was described in reference to FIG. 10 or as was described in reference to FIG. 12, where the values of a different drive strength are used as estimated values for the current drive strength. For example, as with the table of FIG. 12, the values of FIG. 14 are generally close to and less than the setup values for drive strength 2. Therefore, a lower guard banded window my be used using the values from the table of FIG. 12 as the estimated values, Cg. As with the values of the table in FIG. 12, some of the values may require failure recovery if the initially chosen lower guard banded window is not valid for the value.

Although an example has been described using different drive strengths to provide historical values, other methods may be used. The characterizations of similar devices, for example, could have been used instead. Also, the method described above using the historical values apply to any of characterized outputs and any of the input parameters. Furthermore, the methods described herein are also not limited to just 2-dimensional and 3-dimensional characterizations.

The methods described in reference to FIGS. 10–14 generally fall into three general categories: 1.) determining the reduced window bounds, 2.) data interpolation, and 3.) most likely window. The first category refers to determining the reduced window bounds, for which several sources may be used. For example, during the course of development, libraries are characterized several times. Many times, there are only minor differences between the input conditions. The constraint value as measured from an earlier characterization may therefore be used as an estimate. The user can guard band this estimated value by a window, the size of which depends on the estimated change between the older and the new library. The smaller the estimated change, the smaller the user specified guard and size and the fewer number of iterations.

Also, reduced window bounds can be determined using similar operating conditions. For example, constraint measurements depend on several input parameters including input slews (i.e. edge rates) on data and clock, temperature, voltage, possible capacitive loads, etc. Changes in any of these input parameters brings about a corresponding change in the constraint value. This relationship is generally monotonic in that if x and y are the values of input parameters, and f(x) and f(y) are the constraint values, then if x<y, then f(x)<f(y). The measurements which bound the input parameters are generally known before the library is characterized (i.e. the maximum and minimum values of the input parameters are generally known). If the bounding input conditions are characterized before all the other constraint measurements, the non-bounded constraint measurement can start with a reduced window which is determined by the results of the measurements at the bounds. An example of this was discussed above in reference to locations (1,1) and (4,4) of the table in FIG. 10, where the values of (4,1) and (1,4) were used as the reduced window bounds for determining the values of (1,1) and (4,4).

Other examples using the method described in the previous paragraph include drive strength, voltage, temperature, et. For example, constraint measurements for drive strength 2 and 4 are generally bound by measurements for drive strength 1 and 8. Similarly, the constraint values at 1.8V and 3.0V bound the values at 2.0V, 2.2V, and 2.7V. Combinations of various input parameters may also be used, as was described in reference to FIG. 10. For example, the minimum setup time corresponds to maximum voltage, maximum drive strength, minimum data slew, and maximum clock slew. Similarly, the maximum setup time corresponds to minimum voltage, minimum drive strength, maximum data slew, and minimum clock slew. Thus, the constraint values at those conditions bound all the other values of setup time and can be used to determine reduced window bounds.

The second general category refers to data interpolation. Process technologies generally advance in a predictable fashion. Therefore, in several cases, it is possible to estimate the constraint values based on some historic value. Also, it may be possible to extrapolate the constraint value based on two or more previous technologies. For example, it may be possible to reasonably estimate the constraint values in a library corresponding to a newer set of design rules based on an extrapolation from libraries of one or more older sets of design rules. An example was discussed in reference to FIG. 10 where an interpolation of data and clock slew values provided an estimate on the setup values for the interior points (the points not at the four corners of the table). In one embodiment, a bilinear interpolation was used. The estimate (along with the predetermined resolution) was then used to determine the actual constraint measurement. Therefore, to compute the interior values for any variable after the boundary values are computed, data interpolation may be used. Data interpolation may be used on all input parameters such as input edge rates, capacitive load, temperature, voltage, and drive strength.

The third category refers to the most likely window. In the discussions of FIGS. 10–14, one embodiment used the constraint measurements (setup times) from the D-Flop of drive strength 1 and 2 as estimates for the constraint measurements for the D-Flop of strength 2 and 4, respectively. In the example of FIG. 12 discussed above (i.e. determining the constraint values for the D-Flop of drive strength 1 using the values from drive strength 2), a lower guard banded window having and n=0 was selected as the being the most likely window (valid bounding box) because it is known that the values for drive strength 2 are generally less than the values for drive strength 1. However, this type of information may not be known, and therefore, other methods may be used to determine the most likely bounding window (i.e. a particular type of guard band window of a particular size) for a constraint. For example, the most likely bounding box may be estimated from previous libraries and also from similar measurements in the same library. Alternatively, an average or weighted average of the size of similar guard banded windows which have been used may be used to determine the most likely bounding box. For example, this method could be used to estimate the guard banded window for D-Flop of strength 2 and 4.

Therefore, by using historical values (which may be determined in a variety of different ways), the number of iterations needed to perform constraint measurements may be reduced, thus saving simulation time and reducing overall cycle time. Similarly, the method of choosing input parameter values described above in reference to FIGS. 3–5 and the failure recovery described in reference to FIG. 7 also allow for reduced iterations and simulations thus also reducing overall cycle time while improving accuracy.

In the foregoing specification, the invention has been described with reference to specific embodiments. However, one of ordinary skill in the art appreciates that various modifications and changes can be made without departing from the scope of the present invention as set forth in the claims below. For example, the methods described above can be implemented as software instructions stored via a machine-readable medium (i.e. computer readable medium) which, when executed by a processor, causes the processor to perform the methods. Examples of such machine-readable medium include one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the methods can be performed by one processor or multiple processors. Alternatively, any combination of hardware and software may be used to implement the methods discussed herein. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for creating a characterized digital library to be used for circuit design comprising:

selecting a sub-window with an upper boundary and a lower boundary, wherein each of the upper boundary and the lower boundary exists within a window constrained by a first boundary and a second boundary wherein one of either the first boundary or the second boundary is guaranteed to produce a successful simulation and the other of the one of either the first boundary or the second boundary is guaranteed to produce a failed simulation;

generating an upper simulated value for the upper boundary and a lower simulated value for the lower boundary;

when only one of either the upper simulated value and the lower simulated value produces success, performing a binary subdivision to select a simulated characterization value within the window that satisfies a predefined resolution; and performing a failure recovery when both the upper simulated value and the lower simulated value produce one of either success or failure.

2. The method of claim 1 wherein performing the failure recovery comprises:

selecting a new boundary existing outside the sub-window;

generating a new simulated value for the new boundary;

when the new simulated value is the other of either success or failure not produced by the upper simulated value and the lower simulated value, performing the binary subdivision to select the simulated characterization; and repeating the failure recovery when the new simulated value produces the same result as the upper simulated value and the lower simulated value.

3. The method of claim 2 wherein when the binary subdivision is performed, one of either the upper boundary or the lower boundary is the new boundary and the other of the upper boundary and the lower boundary is one of either the upper boundary or the lower boundary that was nearest the new boundary.

4. The method of claim 2 wherein the new boundary is a point within the window and closer to either the first boundary or the second boundary that is guaranteed to produce the other of either success or failure not produced by the upper simulated value and the lower simulated value.

5. The method of claim 2 wherein the new boundary and the farthest away of either the upper boundary or the lower boundary produce a second sub-window that is twice the size of the sub-window.

6. The method of claim 2 wherein repeating the failure recovery comprises redefining the sub-window by replacing one of either the lower boundary or the upper boundary with the new boundary.

7. The method of claim 2 wherein repeating the failure recovery comprises redefining the sub-window by keeping one of either the lower boundary or the upper boundary that is farthest from the new boundary as one of either the lower boundary and the upper boundary and replacing the other of the lower boundary and the upper boundary with the new boundary.

8. The method of claim 1 wherein at least one of the upper simulated value and the lower simulated value is an historical characterization value plus or minus a multiple of the predefined resolution.

9. The method of claim 1 wherein one of the upper simulated value and the lower simulated value is an interpolated value plus or minus a multiple of the predefined resolution and the other of the upper boundary and the lower boundary is the interpolated value.

10. A method for creating a characterized digital library to be used for circuit design comprising:

selecting a sub-window with an upper boundary and a lower boundary, wherein each of the upper boundary and the lower boundary exists within a window constrained by a first boundary and a second boundary wherein one of either the first boundary or the second boundary is guaranteed to produce a successful simulation and the other of the one of either the first boundary or the second boundary is guaranteed to produce a failed simulation, and wherein at least one of the upper boundary and the lower boundary is neither the first boundary nor the second boundary;

generating an upper simulated value for the upper boundary and a lower simulated value for the lower boundary; and when only one of either the upper simulated value and the lower simulated value produces success, performing a binary subdivision to select a simulated characterization value within the window that satisfies a predefined resolution.

11. The method of claim 10 wherein at least one of the upper simulated value and the lower simulated value is an historical characterization value plus or minus a multiple of the predefined resolution.

12. The method of claim 10 wherein one of the upper simulated value and the lower simulated value is an interpolated value plus or minus a multiple of the predefined resolution and the other of the upper boundary and the lower boundary is the interpolated value.

13. The method of claim 10 wherein each of the upper boundary and the lower boundary represents a plurality of input values.

14. The method of claim 13 wherein selecting a sub-window to produce a simulated characterization value that satisfies a predefined resolution for a plurality of input values known to be constrained by a first plurality of input values representing a first lower boundary and a second plurality of input values representing a second lower boundary comprises making the lower boundary the first lower boundary and making the upper boundary the second upper boundary.

15. A machine-readable medium having stored thereon data representing sequences of instructions which, when executed by a processor, cause the processor to perform operations comprising:

selecting a sub-window with an upper boundary and a lower boundary, wherein each of the upper boundary and the lower boundary exists within a window constrained by a first boundary and a second boundary wherein one of either the first boundary or the second boundary is guaranteed to produce a successful simulation and the other of the one of either the first boundary or the second boundary is guaranteed to produce a failed simulation;

generating an upper simulated value for the upper boundary and a lower simulated value for the lower boundary;

when only one of either the upper simulated value and the lower simulated value produces success, performing a binary subdivision to select a simulated characterization value within the window that satisfies a predefined resolution; and performing a failure recovery when both the upper simulated value and the lower simulated value produce one of either success or failure.

16. The machine-readable medium of claim 15 wherein performing the failure recovery comprises:

selecting a new boundary existing outside the sub-window;

generating a new simulated value for the new boundary;

when the new simulated value is the other of either success or failure not produced by the upper simulated value and the lower simulated value, performing the binary subdivision to select the simulated characterization; and repeating the failure recovery when the new simulated value produces the same result as the upper simulated value and the lower simulated value.

17. The machine-readable medium of claim 16 wherein when the binary subdivision is performed, one of either the upper boundary or the lower boundary is the new boundary and the other of the upper boundary and the lower boundary is one of either the upper boundary or the lower boundary that was nearest the new boundary.

18. The machine-readable medium of claim 16 wherein the new boundary is a point within the window and closer to either the first boundary or the second boundary that is guaranteed to produce the other of either success or failure not produced by the upper simulated value and the lower simulated value.

19. The machine-readable medium of claim 16 wherein the new boundary and the farthest away of either the upper boundary or the lower boundary produce a second sub-window that is twice the size of the sub-window.

20. The machine-readable medium of claim 16 wherein repeating the failure recovery comprises redefining the sub-window by replacing one of either the lower boundary or the upper boundary with the new boundary.

21. The machine-readable medium of claim 16 wherein repeating the failure recovery comprises redefining the sub-window by keeping one of either the lower boundary or the upper boundary that is farthest from the new boundary as one of either the lower boundary and the upper boundary and replacing the other of the lower boundary and the upper boundary with the new boundary.

22. The machine-readable medium of claim 15 wherein at least one of the upper simulated value and the lower simulated value is an historical characterization value plus or minus a multiple of the predefined resolution.

23. The machine-readable medium of claim 15 wherein one of the upper simulated value and the lower simulated value is an interpolated value plus or minus a multiple of the predefined resolution and the other of the upper boundary and the lower boundary is the interpolated value.

24. A machine-readable medium having stored thereon data representing sequences of instructions which, when executed by a processor, cause the processor to perform operations comprising:

selecting a sub-window with an upper boundary and a lower boundary, wherein each of the upper boundary and the lower boundary exists within a window constrained by a first boundary and a second boundary wherein one of either the first boundary or the second boundary is guaranteed to produce a successful simulation and the other of the one of either the first boundary or the second boundary is guaranteed to produce a failed simulation, and wherein at least one of the upper boundary and the lower boundary is neither the first boundary nor the second boundary;

generating an upper simulated value for the upper boundary and a lower simulated value for the lower boundary; and when only one of either the upper simulated value and the lower simulated value produces success, performing a binary subdivision to select a simulated characterization value within the window that satisfies a predefined resolution.

25. The machine-readable medium of claim 24 wherein at least one of the upper simulated value and the lower simulated value is an historical characterization value plus or minus a multiple of the predefined resolution.

26. The machine-readable medium of claim 24 wherein one of the upper simulated value and the lower simulated value is an interpolated value plus or minus a multiple of the predefined resolution and the other of the upper boundary and the lower boundary is the interpolated value.

27. The machine-readable medium of claim 24 wherein each of the upper boundary and the lower boundary represents a plurality of input values.

28. The machine-readable medium of claim 27 wherein selecting a sub-window to produce a simulated characterization value that satisfies a predefined resolution for a plurality of input values known to be constrained by a first plurality of input values representing a first lower boundary and a second plurality of input values representing a second lower boundary comprises making the lower boundary the first lower boundary and making the upper boundary the second upper boundary.

* * * * *